United States Patent
Fujioka

(10) Patent No.: US 7,282,824 B2
(45) Date of Patent: Oct. 16, 2007

(54) PRESS-FITTING METHOD AND RECTIFYING DEVICE HAVING PRESS-FITTED MEMBER

(75) Inventor: Tatsumi Fujioka, Chiryu (JP)

(73) Assignee: Denso Corporation, Kariya (JP)

( * ) Notice: Subject to any disclaimer, the term of this patent is extended or adjusted under 35 U.S.C. 154(b) by 403 days.

(21) Appl. No.: 10/733,456

(22) Filed: Dec. 12, 2003

(65) Prior Publication Data
US 2004/0150273 A1 Aug. 5, 2004

(30) Foreign Application Priority Data
Dec. 16, 2002 (JP) .............................. 2002-364485

(51) Int. Cl.
*H02K 11/04* (2006.01)
*H02M 1/00* (2006.01)

(52) U.S. Cl. .................. 310/68 D; 29/831; 29/837; 363/141; 363/145

(58) Field of Classification Search ............. 310/68 D; 363/145, 141; 29/837, 831; 403/36, 11, 403/282
See application file for complete search history.

(56) References Cited

U.S. PATENT DOCUMENTS

| | | | |
|---|---|---|---|
| 3,198,874 A | | 8/1965 | Dahl |
| 4,059,778 A | | 11/1977 | Sohnle |
| 4,118,134 A | * | 10/1978 | Mansel ........................ 403/282 |
| 4,226,454 A | | 10/1980 | Tranberg et al. |
| 4,375,333 A | * | 3/1983 | Clark et al. ................... 356/47 |
| 4,586,075 A | * | 4/1986 | Schwenk et al. ............ 257/687 |
| 4,874,259 A | * | 10/1989 | Sato et al. ................... 384/445 |
| 4,886,392 A | | 12/1989 | Iio |
| 4,943,178 A | * | 7/1990 | Weinstein ..................... 403/259 |
| 5,032,036 A | * | 7/1991 | Murakami et al. ........... 403/282 |
| 5,066,147 A | | 11/1991 | Brandenstein et al. |
| 5,158,390 A | * | 10/1992 | Ito et al. ...................... 403/282 |
| 5,207,525 A | * | 5/1993 | Ross et al. .................... 403/11 |
| 5,598,631 A | * | 2/1997 | Umezawa et al. ...... 29/888.011 |
| 5,716,156 A | * | 2/1998 | Bayer et al. ................. 403/282 |
| 5,828,564 A | | 10/1998 | Mori et al. |

(Continued)

FOREIGN PATENT DOCUMENTS

| | | |
|---|---|---|
| GB | 256353 | 8/1926 |
| JP | A 59-68586 | 4/1984 |
| JP | A-07-246523 | 9/1995 |
| JP | A-08-071680 | 3/1996 |
| JP | A-2000-042845 | 2/2000 |
| JP | A-2002-119029 | 4/2002 |

OTHER PUBLICATIONS

European Office Action, dated Jan. 17, 2007.

*Primary Examiner*—Burton Mullins
(74) *Attorney, Agent, or Firm*—Oliff & Berridge PLC

(57) ABSTRACT

In a rectifying device for a vehicular AC generator, a rectifying element is press-fitted in a positive-side radiation plate. The radiation plate is prepared in a predetermined shape and an engaging hole is punched in the radiation plate. Four grooves are formed in an inner periphery of the radiation plate created by the hole. The rectifying element is press-fitted in the hole while an excess produced between the rectifying element and the inner periphery of the radiation plate is released into the grooves.

12 Claims, 6 Drawing Sheets

U.S. PATENT DOCUMENTS

| | | | |
|---|---|---|---|
| 5,875,953 A * | 3/1999 | Shioya | 228/112.1 |
| 5,982,062 A | 11/1999 | Gautier | |
| 6,082,002 A | 7/2000 | Belon et al. | |
| 6,903,472 B2 * | 6/2005 | Ogi | 310/68 D |
| 2002/0114177 A1 | 8/2002 | DeNardis | |
| 2004/0066102 A1 * | 4/2004 | Sarkar et al. | 310/68 D |

* cited by examiner

US 7,282,824 B2

PRESS-FITTING METHOD AND RECTIFYING DEVICE HAVING PRESS-FITTED MEMBER

CROSS REFERENCE TO RELATED APPLICATION

This application is based on and incorporates herein by reference Japanese Patent Application No. 2002-364485 filed on Dec. 16, 2002.

FIELD OF THE INVENTION

The present invention relates to press-fitting method and a rectifying device having a press-fitted member.

BACKGROUND OF THE INVENTION

An AC generator generates power by using the driving force transmitted from an engine, charges a battery, and supplies power to various kinds of electronic parts. Reducing the size, the weight and the cost of the AC generator while improving the output power is a critical issue to maintain or improve the competitiveness in the market.

A method for manufacturing a rectifying device for an AC generator is proposed in U.S. Pat. Document No. U.S. Pat. No. 5,828,564 (JP-A-10-242671). In this method, a rectifying element is press-fitted in a through hole formed in a radiation plate. The rectifying element is fixed and electrically connected to the radiation plate with a simple process. As a result, the manufacturing cost is reduced.

Furthermore, reliability of the rectifying element and the AC generator using this rectifying element is improved by using this method. If the rectifying element is soldered to the radiating plate, the solder starts melting when the temperature of the rectifying element or the radiation plate exceeds the melting point of the solder. The rectifying element is press-fitted in the radiation plate in this method, and therefore the solder melting problem does not occur.

However, galling occurs in some materials in a press-fitting process in which a base of the rectifying element is press-fitted in the hole formed in the radiation plate. If the base, which is an inserting member, and the radiation plate, which is a receiving member, are made of a copper material, the galling occurs.

When the inserting member is inserted in the hole of the receiving member, an excess is produced between surfaces of the inserting member and the receiving member due to the ductility and the tenacity of copper. The excess is pushed in the inserting direction of the inserting member and hardened as the press-fitting process proceeds because space for releasing the excess is not provided.

When the hardness of the excess becomes higher than the hardness of the inserting member, the inserting member is cracked and its outer periphery partially looses contact with the inner periphery of the receiving member. Namely, a contact area between the outer periphery of the inserting member and the inner periphery of the receiving member decreases. As a result, the tightness of physical and electrical connection between the inserting member and the receiving member decreases. Furthermore, large stress applied to the inserting member due to the hardened excess affects the productivity in the press-fitting process.

SUMMARY OF THE INVENTION

The present invention therefore has an object to provide a press-fitting method for press-fitting an inserting member to a receiving member, by which galling is less likely to occur. The present invention has another object to provide a rectifying device in which a rectifying element is press-fitted in a radiation plate by the press-fitting method.

A press-fitting method of the present invention includes forming an engaging hole in a receiving member, forming a groove in an inner periphery of the receiving member, and press-fitting an inserting member in the engaging hole of the receiving member while releasing an excess to the groove.

Further, a press-fitting method of the present invention includes punching an engaging hole in a receiving member having hardness higher than that of a receiving member while creating a hardened inner periphery surface on the receiving member, roughening the hardened inner periphery surface, and press-fitting the inserting member in the engaging hole.

Still further, a press-fitting method of the present invention includes punching an engaging hole in the receiving member while forming a sheared surface and a fractured surface on an inner periphery of the receiving member, forming at least one groove in the inner periphery, and press-fitting the inserting member in the engaging hole by inserting the inserting member from an end of the receiving member adjacent to the sheared surface.

The excess is released to the groove during the press-fitting of the inserting member in the receiving member. Thus, galling due to a hardened excess is less likely to occur, and physical and electrical connections between the inserting member and the receiving member is maintained. Furthermore, stress applied to the inserting member due to the hardened excess is reduced, and the productivity in the press-fitting process is maintained.

The inserting member is inserted from the side adjacent to the sheared surface. The hole is more precisely sized on this side than on the other side adjacent to the fractured surface. Thus, the inserting member can be more easily set in the receiving member on this side than on the other side upon the start of the press-fitting.

A rectifying device of the present invention is used for a vehicular AC generator having a stator and a rotor. The rectifying device has a rectifying element for rectifying AC voltage induced in the stator coil of the stator when the rotor is rotated and a radiation plate. The radiation plate has an engaging hole that creates an inner periphery of the radiation plate. The inner periphery of the radiation plate has multiple grooves. The rectifying element is press-fitted in the engaging hole of the radiation plate.

By using the inserting and receiving members and the press-fitting method, the reliability and productivity of the rectifying device and the vehicular AC generator using the rectifying device are improved.

BRIEF DESCRIPTION OF THE DRAWINGS

The above and other objectives, features and advantages of the present invention will become more apparent from the following detailed description made with reference to the accompanying drawings. In the drawings.

DETAILED DESCRIPTION OF THE PREFERRED EMBODIMENT

Figure 1:
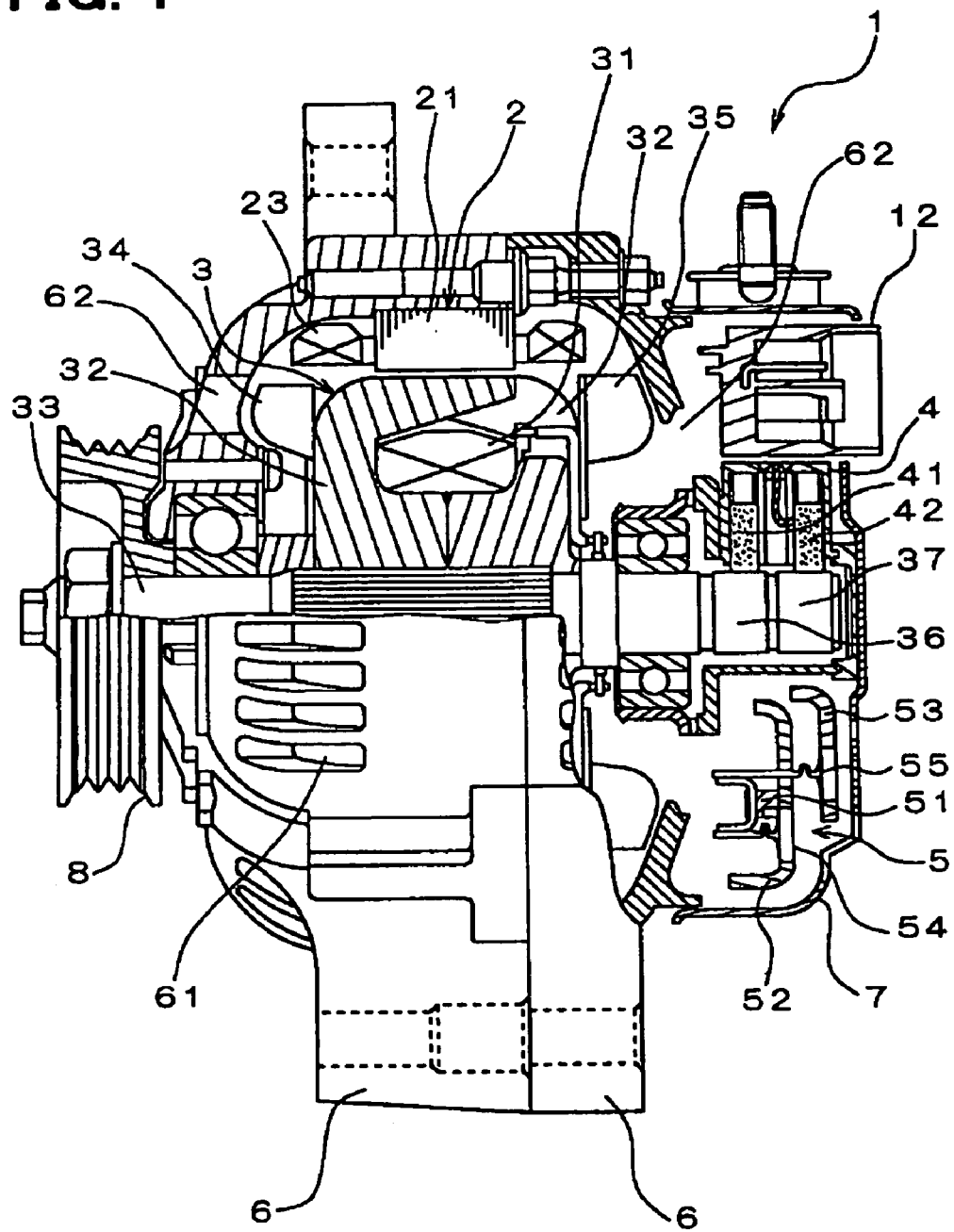
FIG. 1 is a cross-sectional view of a vehicular AC generator according to first to fifth embodiments of the present invention.

The preferred embodiments of the present invention will be explained with reference to the accompanying drawings. In the drawings, the same numerals are used for the same components and devices.

First Embodiment

Referring to FIG. 1, an AC generator 1 for a vehicle includes a stator 2, a rotor 3, a brushing device 4, a rectifying device 5, a frame 6, a cover 7, and a pulley 8. The stator 2 has a stator core 21 and a three-phase stator coil 23 wound at a predetermined interval around slots formed in the stator core 21.

The rotor 3 has a field coil 31, pole cores 32, and a rotor shaft 33. The field coil 31 is constructed of an insulated copper wire concentrically wound in a cylindrical shape. Each pole core 32 has six claw poles and covers the field coil 31 from opposite sides. The rotor shaft 33 passes through the center of the pose cores 32.

An axial-flow type cooling fan 34 is welded to an end face of one of the pole cores 32 located adjacent to the pulley 8. The cooling fan 34 is used for blowing cooling air in the axial direction and in the radial direction. A centrifugal type cooling fan 35 is welded to an end face of the other pole core 32 for blowing cooling air in the radial direction.

The brushing device 4 having brushes 41, 42 is used for passing exciting current from the rectifying device 5 to the field coil 31. The brushes 41, 42 are pressed against slip rings 36, 37 on the rotational shaft 33, respectively.

The rectifying device 5 rectifies the three-phase AC voltage induced in the three-phase stator coil 23 to a DC voltage. The rectifying device 5 includes a terminal base 51, a positive-side radiation plate 52, a negative-side radiation plate 53, and rectifying elements (inserting members) 54, 55. The terminal base 51 contains electrodes for wiring. The positive-side and the negative-side radiation plates 52, 53 are arranged a predetermined distance away from each other. The rectifying elements 54, 55 are press-fitted in an engaging hole formed by punching in the respective radiation plates (receiving members) 52, 53.

A frame 6 houses the stator 2 and the rotor 3. The rotor 3 is supported so that it can rotate about the rotator shaft 33. The stator 2 is fixed at a position a predetermined distance away from the outer peripheral of the pole cores 32. The frame 6 has cooling-air exit windows 61 and a cooling-air intake window 62. The exit windows 61 are opposed to the stator coil 23 projected in the axial direction from the end face of the stator core 21. The intake window 62 is located at the axial end face of the frame 6. The cover 7 covers parts arranged outside the frame 6 away from the pulley 8, including the brushing device 4, the rectifying device 5 and an IC regulator 12, for protecting the parts.

The rotor 3 is rotated in the predetermined direction by torque transmitted from the engine (not shown) to the pulley 8 via a belt (not shown). When an exciting voltage is applied to the field coil 31 while the rotor 3 is under rotation, the claw poles of the pole cores 32 are excited. As a result, a three-phase AC voltage is generated in the stator coil 23 and DC voltage is provided at the output terminal of the rectifying device 5.

Figure 2:
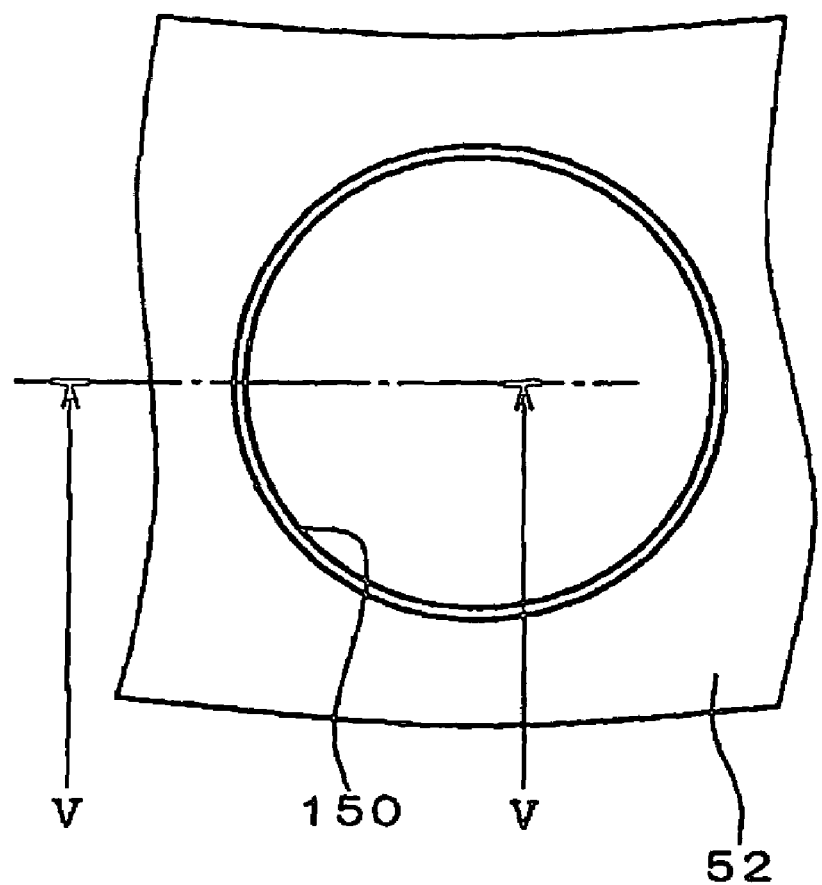
FIG. 2 is a partial view of a positive-side radiation plate according to first and second embodiments.
Figure 3:
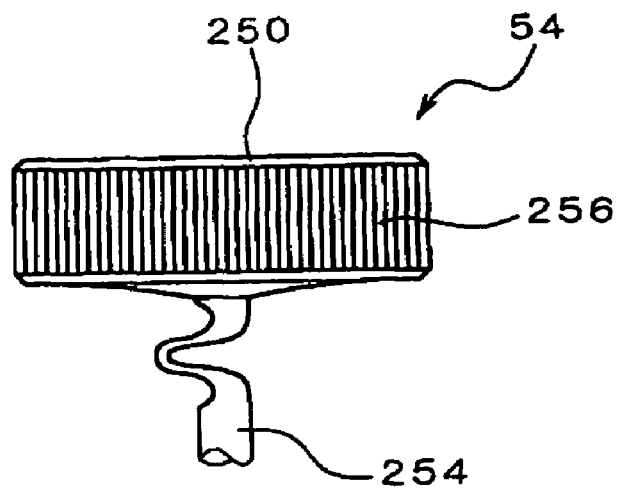
FIG. 3 is a side view of a rectifying element according to the first to fifth embodiments.
Figure 4:
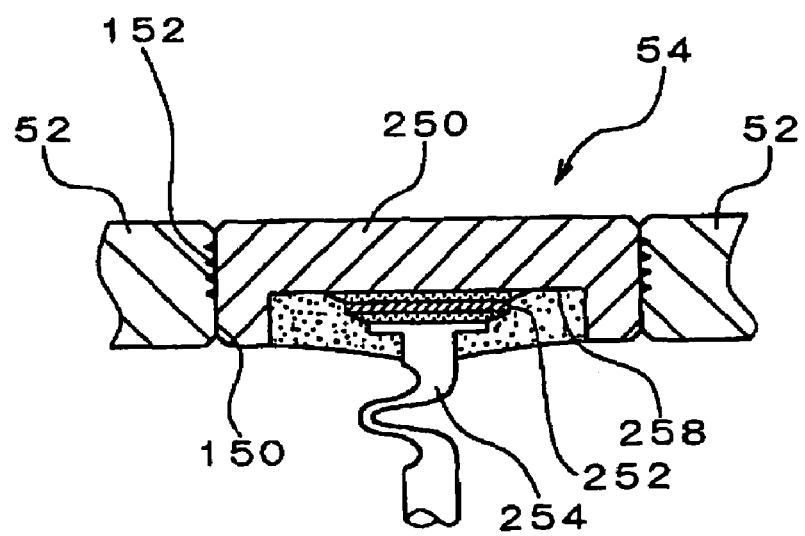
FIG. 4 is a cross-sectional view of the rectifying element and a positive-side radiation plate according to the first embodiment.

A method of press-fitting the rectifying element 54 in the positive-side radiation plate 52 will be discussed referring to FIGS. 2 through 4. The rectifying element 55 is press-fitted in the negative-side radiation plate 53 in the same manner as the press-fitting of the rectifying element to the positive-said radiation plate 52. Therefore, it will not be discussed.

The radiation plate 52 has an engaging hole 150 in which the rectifying element 54 is press-fitted and by which an inner periphery of the radiation plate 52 is created. Grooves 152 are formed in the inner periphery of the radiation plate 52 in a circumferential direction and in a section adjacent to a sheared surface (the upper portion of FIG. 4). The grooves 152 are arranged in circumference or slanted off circumference and apart from each other in the direction that the engaging hole 150 is formed. The grooves 152 are not formed in a section adjacent to a fractured surface (the lower portion of FIG. 4).

The rectifying element 54 includes a heat sink 250, a semiconductor pellet 252 and a lead 254. The heat sink 250 is a cylindrical metal base of the rectifying element 54 and used as an electrode. It has a knurl portion 256 on its outer periphery and a recess portion 258 at one of its ends. The bottom surface of the recess portion 258 is used as a soldering surface to which the semiconductor pellet 252 is soldered.

The heat sink 250 is made of copper and its surface is plated for soldering and protection from oxidation due to contact with air. The hardness of the heat sink 250, which is equal to 160 Hv, is higher than the hardness of the hardened radiation plate 52 around the hole, which is between 140 and 150 Hv. One surface of the semiconductor pellet 252 is soldered to the heat sink 250, and the lead 254 is soldered to the other surface of the semiconductor pellet 252.

Figure 5:
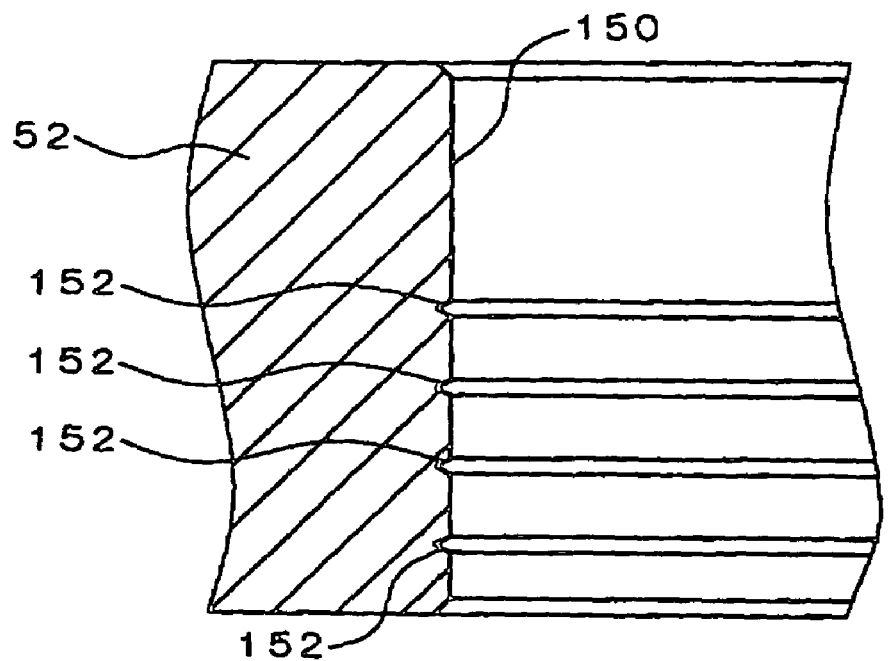
FIG. 5 is an enlarged cross-sectional view taken along a V-V line of FIG. 2.
Figure 6:
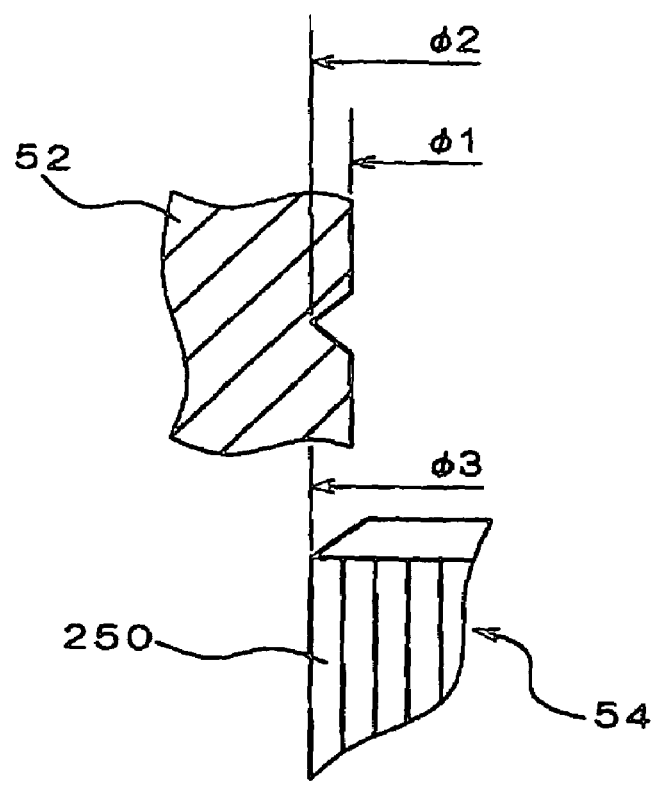
FIG. 6 is a diagram showing the size of peripheral-direction grooves shown in FIG. 5.

As shown in FIG. 5, four grooves 152 are formed in the inner periphery of the radiation plate 52 in a portion adjacent to the side from which the rectifying element 54 is inserted (the lower side in FIG. 5). A depth of each groove 152 is defined so that a root diameter $\phi 2$ of the radiation plate 52 at the bottom of the groove 152 is substantially equal to an outer diameter $\phi 3$ of the heat sink 250 as shown in FIG. 6. If an inner diameter $\phi 1$ of the engaging hole 150 is set to about 13 mm, the outer diameter $\phi 3$ is set 0.2 mm larger than the inner diameter $\phi 1$. The root diameter $\phi 2$ is set equal to the outer diameter $\phi 3$ (the groove depth of 0.1 mm), and the groove width is set to 0.1 mm.

The grooves 152 are formed in the radiation plate 52 that has a thickness of about 4 mm. However, more than four grooves 152 may be formed and the grooves 152 may be uniformly arranged in the entire inner peripheral. Furthermore, it is preferable to change the shape and the distance between the grooves 152 as appropriate so that galling is less likely to occur even when the press-fitting process proceeds.

To press-fit the rectifying element 54 (inserting member) in the positive-side radiation plate 52, the radiation plate 52 is prepared in a predetermined shape. Then, the engaging hole 150 is formed by punching press (engaging hole forming step). The four grooves 152 are formed in the inner periphery of the radiation plate 52 (groove forming step). The rectifying element 54 is press-fitted while an excess produced as the rectifying element 54 is further inserted in the hole 150 is released to the groove 152 (press-fitting step).

The excess is released to the grooves 152 during the press-fitting of the rectifying element 54 in the hole 150. Moreover, the multiple grooves 152 enable the excess to be dividedly released into different grooves 152. Therefore, the excess does not build up in one place and galling is less likely to occur. Although galling is more likely to occur if both heat sink 250 and the radiation plate 52 are made of copper, the galling is effectively reduced with this configuration.

Furthermore, the grooves 152 are formed in the inner periphery of the radiation plate 52 apart from each other in the direction that the engaging hole 150 is formed. Since the excess produced along the direction that the rectifying element 54 is press-fitted is dividedly released into the multiple grooves 152, the galling can be reduced.

The grooves 152 are arranged in the inner periphery of the radiation plate 52 and on the side from which the rectifying element 54 is inserted for press-fitting. Thus, the excess produced by the press-fitting of the rectifying element 54 can be dividedly released from the early stage of the press-fitting step.

The root diameter $\phi 2$ is set substantially equal to the outer diameter $\phi 3$. Therefore, the excess produced by the press-fitting of the rectifying element 54 can be dividedly released into each groove 152. The galling is less likely to occur during press-fitting of the rectifying element 54 into the radiation plate 52 with this configuration. Consequently, the physical and the electrical connections between the rectifying element 54 and the radiation plate 52 are maintained and the stress caused by the excess is reduced.

Second Embodiment

Figure 7:
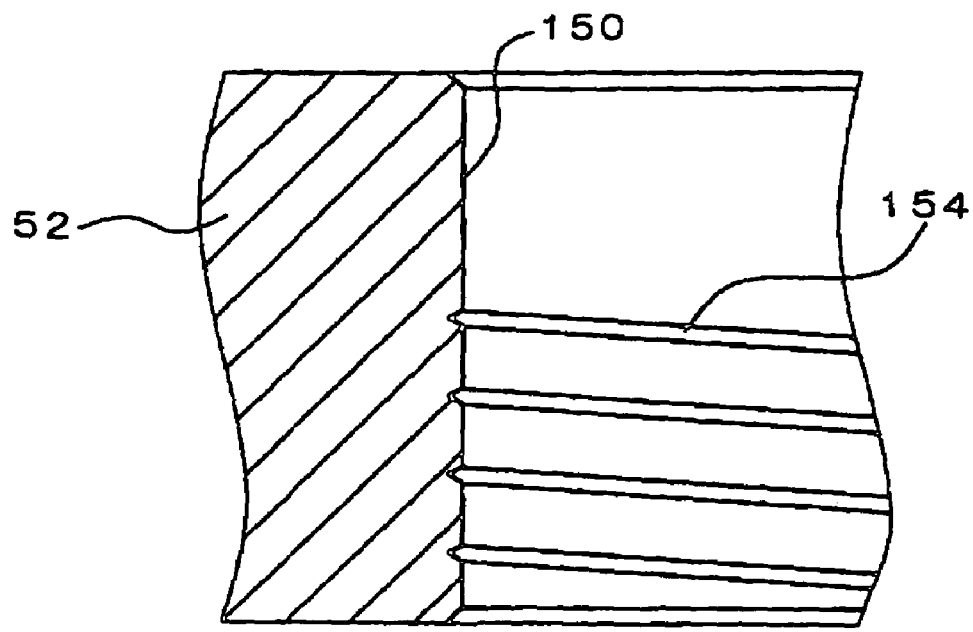
FIG. 7 is a partial cross-sectional view showing a modification of the grooves formed in the engaging hole of the positive-electrode side radiation plate.

A groove 154 is formed in a spiral in the inner periphery of the positive-side radiation plate 52 as shown in FIG. 7. The rest of configuration of the radiation plate 52 is the same as the first embodiment. The groove 154 performs the same function as the multiple grooves 152 of the first embodiment. It functions as if it is constructed of multiple grooves with respect to the direction in which the rectifying element 54 is inserted in the radiation plate 52. Thus, an excess produced by the press-fitting of the rectifying element 54 can be dividedly released to the groove 154.

The groove 154 has an advantage over the grooves 152 in the groove forming step. In the groove forming step of the groove 154, only one groove is formed in a series of machine works while multiple series of machine works are required to form the grooves 152. Namely, the groove forming step of the groove 154 is simplified in comparison with that of the grooves 152.

Third Embodiment

Figure 8:
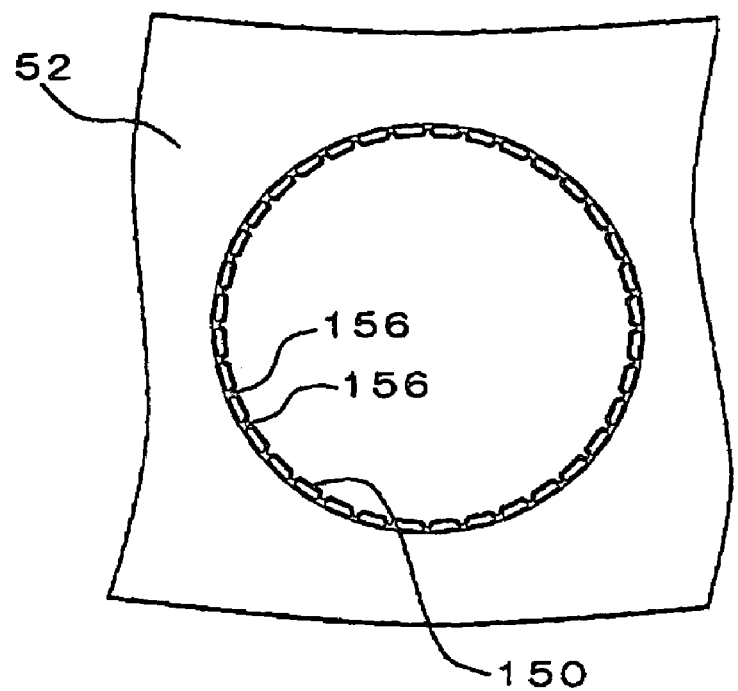
FIG. 8 is a partial cross-sectional view showing another modification of the grooves formed in the engaging hole of the positive-electrode side radiation plate.
Figure 9:
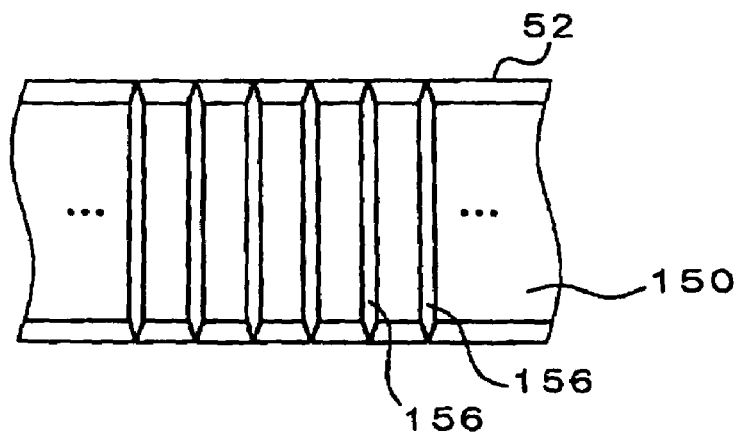
FIG. 9 is a partial development elevation showing the inner peripheral surface of the engaging hole of the positive-electrode side radiation plate shown in FIG. 8.

Referring to FIGS. 8 and 9, multiple grooves 156 are formed in the inner periphery of the positive-side radiation plate 52. The grooves 156 are formed in the direction that the engaging hole 150 is formed and apart from each other in the circumferential direction of the radiation plate 52. The rest of configuration is the same as the first embodiment.

An excess produced during the press-fitting of the rectifying element 54 in the hole 150 is released into the grooves 156. Thus, the excess is less likely to build up and galling between the radiation plate 52 and the rectifying element 54 is reduced. By forming the grooves 156 in the entire inner periphery of the radiation plate 52 as shown in FIG. 8, the excess is effectively released into the grooves 156.

It is preferable that each groove 156 has a depth of about 0.1 mm and a width of about 0.1 mm. If the inner diameter $\phi 1$ of the engaging hole 150 is about 13 mm, it is preferable that about 40 to 78 grooves 156 are provided so that the necessary contact area for securing the rectifying element 54 in the radiation plate 52 is maintained.

Fourth Embodiment

Figure 10:
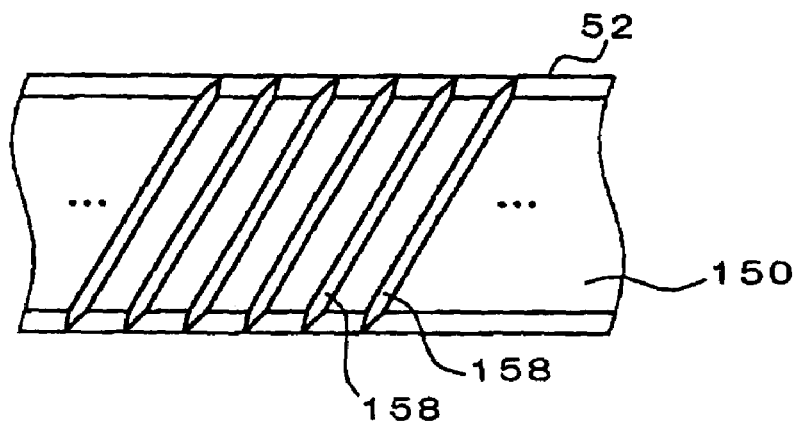
FIG. 10 is a diagram showing a modification of plural grooves shown in FIG. 9.

Referring to FIG. 10, multiple grooves 158 are in the inner periphery of the positive-side radiation plate 52. The grooves 158 are slanted in the circumference direction of the radiation plate 52. With this configuration, an excess produced during the press-fitting of the rectifying element 54 to the radiation plate 52 is dividedly released into the grooves 158.

Fifth Embodiment

Figure 11:
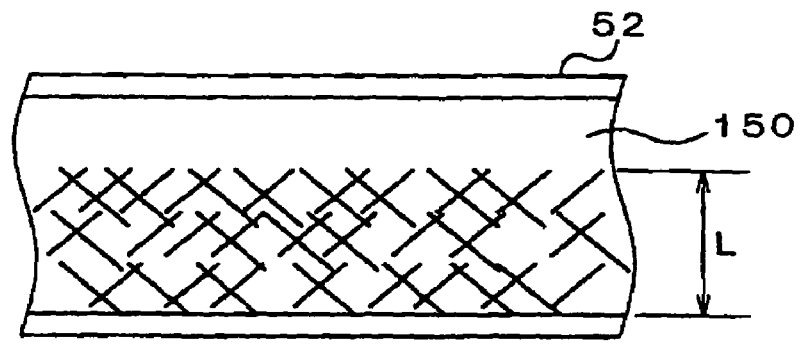
FIG. 11 is a development elevation showing the inner peripheral surface of the engaging hole formed in the positive-electrode side radiation plate of a second embodiment.

As shown in FIG. 11, a part of a hardened inner periphery surface of the positive-side radiation plate 52 is roughened. At least the surface in the area defined by an opening of the engaging hole 150 and a depth L, which is preferably larger than a thickness of the radiation plate 52, is roughened. An excess produced by the press-fitting of the rectifying element 54 moves in the direction that the rectifying element 54 is inserted. Thus, the surface adjacent to the opening is preferable to be roughened for effective releasing of the excess. An entire hardened inner periphery surface can be roughened.

The radiation plate 52 is prepared in a predetermined shape and the engaging hole 150 is punched prior to the press-fitting of the rectifying element 54 (engaging hole forming step). By this engaging hole forming step, a hardened inner periphery surface of the radiation plate 52 is created. The hardened inner periphery surface of the radiation plate 52 is then roughened (surface roughening step). Then, the rectifying element 54 is press-fitted in the direction that the engaging hole 150 is formed (press-fitting step).

In the surface roughening step, the surface is roughened by wire brushing, sanding, or lathe turning. In the wire brushing, the surface is scratched with a wire brush. In the sanding, the surface is sanded with a sand paper. In the lathe turning, the surface is turned by a lathe turning machine. In any cases, flaws having a depth of 10 to 15 μm are formed on the surface, and the roughness of the surface becomes equal to or larger than 20 Z. The hardness of the surface is reduced to about 80 Hv, which is substantially equal to the hardness of other portions of the radiation plate 52. Galling caused by the excess hardened during the press-fitting the rectifying element 54 is reduced. Therefore, the physical and the electrical connections between the rectifying element 54 and the radiation plate 52 are maintained. Moreover, stress due to the excess is reduced.

The present invention is not limited to the above-described embodiments, and various modifications may be made without departing from the subject matter of the present invention. For example, the inserting member is not limited to a heat sink of a rectifying element. The grooves can be formed in a section of the radiation plate adjacent to the fractured surface.

Forming grooves in the inner periphery of the radiation plate 52 and roughening the hardened inner periphery surface of the radiation plate 52 may be performed in one step. When the heat sink 250 of the rectifying element 54 and the positive-electrode radiation plate 52 are made of a material other than copper, galling can be reduced with the present invention.

What is claimed is:

1. A press-fitting method for press-fitting an inserting member in a receiving member, comprising:
   forming an engaging hole in the receiving member;
   forming at least one groove in an inner periphery of the receiving member, the inner periphery created by the engaging hole; and
   press-fitting the inserting member in the engaging hole from one side of the receiving member while releasing an excess into the groove, wherein
   the forming step of the groove forms a plurality of grooves in a direction that the engaging hole is formed;
   the grooves are slanted in a circumferential direction;
   the inserting member is a base of a rectifying element and is used as an electrode;
   the receiving member is a heat radiation plate of the rectifying element;
   the rectifying element has a disk shape including a diameter which is larger than a thickness of the rectifying element so that the rectifying element comprises a flattened disk shape; and
   the grooves are predominantly disposed on the one side of the receiving member.

2. The press-fitting method according to claim 1, wherein:
   the inserting member and the receiving member are made of copper;
   the inserting member has a hardness higher than a hardness of the receiving member; and
   the engaging hole forming step is performed by punching.

3. The press-fitting method according to claim 1, wherein the grooves are arranged apart from each other in the circumferential direction.

4. The press-fitting method according to claim 1, wherein the groove forming step forms a plurality of grooves so that a root diameter of the receiving member at a bottom of each groove is substantially equal to an outer diameter of the inserting member.

5. The press-fitting method according to claim 1, wherein the grooves are formed in a portion adjacent to a side from which the inserting member is inserted.

6. The press-fitting method according to claim 1, wherein each groove on the inner periphery of the engaging hole has a ring shape.

7. The press-fitting method according to claim 1, wherein the grooves on the inner periphery of the engaging hole provide a spiral ring shape.

8. The press-fitting method according to claim 1, wherein the grooves on the inner periphery of the engaging hole provide a striped pattern in parallel to a center axis of the rectifying element.

9. A press-fitting method for press-fitting an inserting member in a receiving member, comprising:
   punching an engaging hole in the receiving member while forming a sheared surface and a fractured surface on an inner periphery of the receiving member, the inner periphery created by the engaging hole;
   forming a plurality of grooves in the inner periphery; and
   press-fitting the inserting member in the receiving member by inserting the inserting member from an end of the receiving member adjacent to the sheared surface, wherein
   the inserting member is a base of a rectifying element and is used as an electrode;
   the receiving member is a heat radiation plate of the rectifying element;
   the rectifying element has a disk shape including a diameter which is larger than a thickness of the rectifying element so that the rectifying element comprises a flattened disk shape; and
   the grooves are predominantly disposed on the sheared surface of the inner periphery.

10. The press-fitting method according to claim 9, wherein each groove on the inner periphery of the engaging hole has a ring shape.

11. The press-fitting method according to claim 9, wherein the grooves on the inner periphery of the engaging hole provide a spiral ring shape.

12. The press-fitting method according to claim 9, wherein the grooves on the inner periphery of the engaging hole provide a striped pattern in parallel to a center axis of the rectifying element.

* * * * *